US012467127B2

(12) United States Patent
Lei et al.

(10) Patent No.: US 12,467,127 B2
(45) Date of Patent: Nov. 11, 2025

(54) MOLYBDENUM MONOLITHIC PHYSICAL VAPOR DEPOSITION TARGET

(71) Applicant: Applied Materials, Inc., Santa Clara, CA (US)

(72) Inventors: Jianxin Lei, Fremont, CA (US); Kirankumar Neelasandra Savandaiah, Bangalore (IN); Andrew Moe, Santa Clara, CA (US); Madan Kumar Shimoga Mylarappa, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/799,515

(22) Filed: Aug. 9, 2024

(65) Prior Publication Data

US 2025/0075309 A1 Mar. 6, 2025

Related U.S. Application Data

(60) Provisional application No. 63/536,230, filed on Sep. 1, 2023.

(51) Int. Cl.
*C23C 14/34* (2006.01)
*H01J 37/34* (2006.01)

(52) U.S. Cl.
CPC ...... *C23C 14/3414* (2013.01); *H01J 37/3423* (2013.01); *H01J 37/3426* (2013.01)

(58) Field of Classification Search
None
See application file for complete search history.

(56) References Cited

U.S. PATENT DOCUMENTS

| | | | | |
|---|---|---|---|---|
| 6,149,776 | A | 11/2000 | Tang et al. | |
| 2005/0178334 | A1* | 8/2005 | Shinma | C23C 16/4581 118/725 |
| 2006/0070876 | A1* | 4/2006 | Wu | H01J 37/3423 204/192.12 |
| 2018/0044778 | A1 | 2/2018 | Bailey et al. | |
| 2018/0286646 | A1* | 10/2018 | Kuroda | C23C 14/14 |
| 2020/0258723 | A1 | 8/2020 | Savandaiah et al. | |
| 2021/0087672 | A1* | 3/2021 | Nakamura | H01J 37/3423 |
| 2022/0290290 | A1 | 9/2022 | Ohno et al. | |

FOREIGN PATENT DOCUMENTS

| | | | |
|---|---|---|---|
| JP | 2005533930 | A | 11/2005 |
| JP | 2022058160 | A | 4/2022 |

OTHER PUBLICATIONS

International Search Report and Written Opinion issued to Application No. PCT/US2024/041769 on Dec. 4, 2024 in 10 pages.

* cited by examiner

*Primary Examiner* — Jason Berman
(74) *Attorney, Agent, or Firm* — Patterson + Sheridan, LLP

(57) ABSTRACT

The disclosure relates to a target for physical vapor deposition processes. In one embodiment, a physical vapor deposition (PVD) target, includes a monolithic target with a support region partially defined by a process face and radial sidewalls; and a recess within a mounting face of the monolithic target, the recess disposed opposite the process face and extending radially outward of the radial sidewalls.

17 Claims, 3 Drawing Sheets

FIG. 3

MOLYBDENUM MONOLITHIC PHYSICAL VAPOR DEPOSITION TARGET

CROSS-REFERENCE TO RELATED APPLICATIONS

This application claims priority to U.S. Provisional Patent Application Ser. No. 63/536,230 filed on Sep. 1, 2023, which is herein incorporated by reference in its entirety.

BACKGROUND

Field

Embodiments of the present subject matter generally relates to physical vapor deposition. More particularly, the subject matter relates to a sputtering target for use in a physical vapor deposition chamber and process.

Description of the Related Art

Physical Vapor Deposition (PVD) is a crucial thin-film deposition technique extensively employed in semiconductor substrate processing to create thin layers of materials with enhanced properties. PVD operates under vacuum conditions and involves the evaporation or sputtering of target materials, such as metals or ceramics, onto a semiconductor substrate to form thin films. In sputtering, high-energy ions bombard the target material of the target assembly, dislodging atoms from a target that are then deposited onto the substrate. PVD is highly versatile, allowing for precise control over film thickness, uniformity, and composition, making it ideal for fabricating various semiconductor components, including integrated circuits, microelectromechanical systems (MEMS), and optical coatings. The deposited thin films provide essential functionalities, such as conductive layers for interconnections and diffusion barriers, and contribute to enhancing device performance, reliability, and miniaturization in modern semiconductor manufacturing processes.

The choice of target material is critical as it directly determines the properties and characteristics of the thin film being deposited. Different applications require different materials with specific properties. For example, semiconductor devices may require thin films made of metals like aluminum, molybdenum, copper, or tungsten for interconnects and thermal management, or dielectric materials like silicon dioxide or silicon nitride for insulating layers. Other specialized applications may demand exotic materials like magnetic alloys or refractory compounds. In all target material choices, throughput and target life are always a key consideration when reviewing a manufacturing process.

To ensure high-quality thin films, the target material must be pure and have a uniform composition. Additionally, the design of a target assembly, target life span, the shape and size of the target material, and the corresponding relations all influence the deposition process, as they influence the distribution, thickness of the deposited thin film on the substrate, and service life of the target assembly.

Therefore, there exists a need in the art for a sputtering target apparatus with an improved life span.

SUMMARY

The disclosure relates to a target for physical vapor deposition processes. In one embodiment, a physical vapor deposition (PVD) target assembly, includes a monolithic target with a support region partially defined by a process face and radial sidewalls; and a recess within a mounting face of the monolithic target, the recess disposed opposite the process face and extending radially outward of the radial sidewalls.

In another embodiment, a PVD target assembly, includes a monolithic target with a support region partially defined by a process face and radial sidewalls; a mounting region disposed radially outward of the support region. The mounting region includes a mounting face and a channel. The mounting region includes an upper face disposed between the process face of the support region and the mounting face. The channel is disposed in the upper face. The PVD target assembly also includes a recess within a mounting face and is disposed opposite the process face and extends radially outward of the radial sidewalls.

In another embodiment, a PVD target assembly, includes a monolithic target with a support region partially defined by a process face and radial sidewalls; a mounting region disposed radially outward of the support region. The mounting region includes a mounting face and a channel. The mounting region includes an upper face disposed between the process face of the support region and the mounting face. The channel is disposed in the upper face. The PVD target assembly also includes a recess within a mounting face and is disposed opposite the process face and extends radially outward of the radial sidewalls. The recess also includes a recess diameter of about 90% of the PVD target diameter.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of target assemblies for use in substrate processing chambers, such as for a physical vapor deposition (PVD) system, are provided herein.

Figure 1:
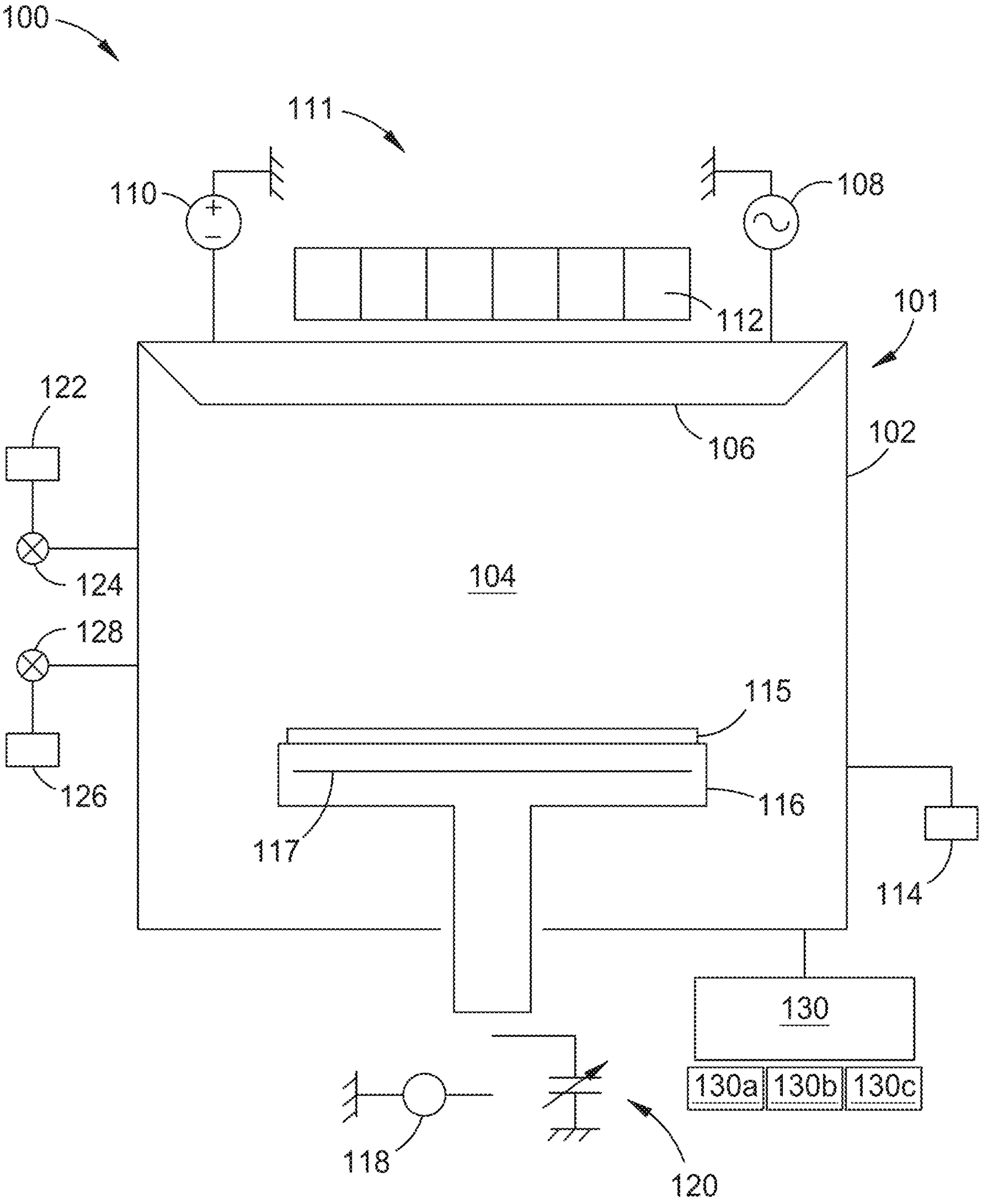
FIG. 1 is a schematic view of a physical vapor deposition processing system.

FIG. 1 illustrates a schematic view of a physical vapor deposition (PVD) processing system 100, according to some embodiments. The PVD system 100 includes a chamber 101. The PVD system 100 may be used to perform the methods described herein. The chamber 101 is a PVD chamber. It is to be understood that the chamber 101 is an exemplary PVD chamber and other PVD chambers may be used with the target assemblies described herein.

The chamber 101 includes a chamber body 102 having chamber walls that define a processing volume 104. The chamber 101 further includes a target 106 and a substrate support 116, disposed within the processing volume 104. The target 106 is described in more detail below.

The substrate support 116 is operable to secure (e.g., chuck) a substrate 115 to the substrate support 116. The substrate is disposed within the processing volume 104 during substrate processing operations. In some embodiments, the substrate support 116 includes an electrode 117 to chuck the substrate 115. In other embodiments the substrate support 116 uses vacuum to chuck the substrate 115.

The PVD system 100 further includes an RF power supply 108, a vacuum source 114, a controller 130, an auto capacitance tuner (ACT) 120, a power source 118, a reactive gas source 126, a sputter gas source 122, a DC power supply 110, and a magnetron assembly 111.

The target 106 can be coupled to the RF power supply 108 and the DC power supply 110. Power provided from RF power supply 108 and/or the DC power supply 110 to the target 106 can be used to ignite a plasma in the processing volume 104. The plasma is formed by a sputter gas. For example, the sputter gas may be argon (Ar), oxygen (O), hydrogen (H), fluorine (F), chlorine (Cl), any combination thereof. Other reactive gases are also contemplated. The plasma may be created in the processing volume 104 by a capacitive process, an inductive process, or other plasma generation methods.

The magnetron assembly 111 is disposed the above the substrate support 116. The magnetron assembly 111 directs magnetic fields within the processing volume 104 to regions around the target 106 in the processing volume 104. These magnetic fields can help increase a density of the plasma formed in the processing volume 104 around the target 106. In one embodiment, the magnetron assembly 111 can include one or more magnets 112 (e.g., strength magnets). The one or more magnets 112 may be arranged to provide a magnetic field which extends through the target 106 and into the processing volume 104. In some embodiments, the generated magnetic fields can trap electrons along magnetic field lines to increase the plasma ion density by enabling additional electron-gas atom collisions. The magnetron assembly 111 and the magnets 112 are adjustable to adjust the magnetic field within the process volume 104.

The vacuum source 114 is fluidly coupled to the processing volume 104. The vacuum source 114 is any device or assembly which may create a vacuum. For example, the vacuum source 114 is a vacuum pump. The vacuum source 114 maintains the processing volume 104 at a specified process pressure during processing operations. The vacuum source 114 also evacuates sputter gases, reactive gases, and other gases from the processing volume 104.

The power source 118 is coupled to the electrode 117 in the substrate support 116. The electrode 117 induces an electrical bias on the substrate 115. The power source 118 may be a RF or DC power source. In some embodiments, a self-bias may form on the substrate 115 during processing. In some embodiments, the electrode 117 may be coupled to the ACT 120. The ACT 120 is operable to adjust the capacitance (and thus impedance) from the substrate support 116 to a ground.

The reactive gas source 126 is fluidly connected to the processing volume 104. A reactive gas flow controller 128, such as a mass flow controller (MFC), may be disposed between a reactive gas source 126 and the process volume 104. The reactive gas flow controller 128 controls a flow of the reactive gas (e.g., oxygen) from the reactive gas source 126 to the processing volume 104.

The sputter gas source 122 is fluidly connected to the processing volume 104. A sputter gas flow controller 124, such as a MFC, may be disposed between the sputter gas source 122 and the processing volume 104. The sputter gas flow controller 124 controls a flow of the sputter gas (e.g., argon) from the sputter gas source 122 to the processing volume 104.

The chamber 101 further includes a controller 130. The controller 130 includes a programmable central processing unit (CPU) 130*a* which is operable with a memory 130*b* (e.g., non-volatile memory) and support circuits 130*c*. The support circuits are conventionally coupled to the CPU and comprise cache, clock circuits, input/output subsystems, power supplies, and the like, and combinations thereof coupled to the various components of PVD system 100, to facilitate control thereof. The CPU 130*a* is one of any form of general purpose computer processor used in an industrial setting, such as a programmable logic controller (PLC), for controlling various components and sub-processors of the processing system. The memory 130*b*, coupled to the CPU 130*a*, is non-transitory and is typically one or more of readily available memories such as random access memory (RAM), read only memory (ROM), floppy disk drive, hard disk, or any other form of digital storage, local or remote.

Typically, the memory 130*b* is in the form of a non-transitory computer-readable storage media containing instructions (e.g., non-volatile memory), which when executed by the CPU 130*a*, facilitates the operation of PVD system 100. The instructions in the memory 130*b* are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD)) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 130 may be used with one or any combination of the various systems described herein.

As used herein, 'a CPU," "a processor," "at least one processor" or "one or more processors" generally refers to a single processor configured to perform one or multiple operations or multiple processors configured to collectively perform one or more operations. In the case of multiple processors, performance the one or more operations could be divided amongst different processors, though one processor may perform multiple operations, and multiple processors could collectively perform a single operation. Similarly, "memory," "at least one memory," or "or more memories" generally refers to a single memory configured to store data and/or instructions, multiple memories configured to collectively store data and/or instructions.

Figure 2:
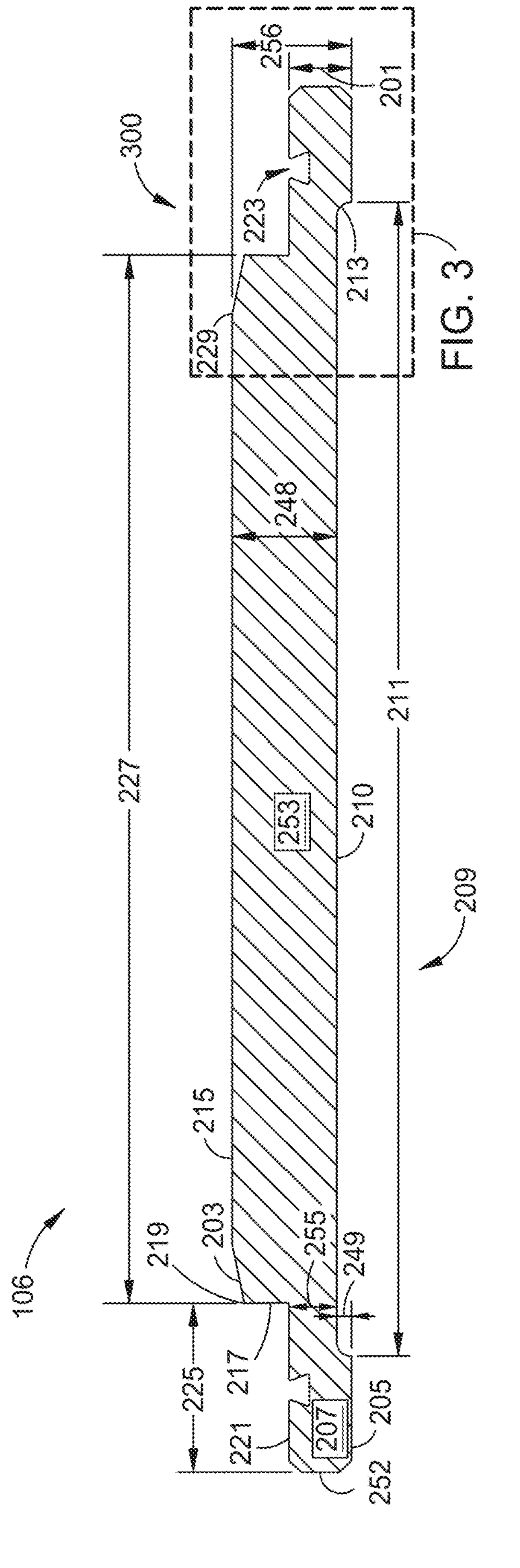
FIG. 2 is schematic, cross-sectional view of a target assembly according to some embodiments described herein.

FIG. 2 is a schematic, cross-sectional view illustrating the target 106, according to embodiments described in greater detail below. The target 106 is a single monolithic body. In some embodiments, the target 106 is a monolithic molybdenum (Mo) physical vapor deposition (PVD) target, i.e., a PVD target. According to some embodiments, the target 106 is manufactured from a solid body. In other embodiments, one or more layers are hot isostatic pressed together to form the target 106. The target 106 material is molybdenum (Mo) according to some embodiments. In other embodiments, the target 106 material is molybdenum with trace amounts of other elements. In some embodiments, the target material of the target 106 includes Mo that has a metal purity of greater than 99%, such as greater than 99.99%, or greater than 99.999%, or even greater than 99.9999%. The target material has a coefficient of thermal conductivity between about 120 (Watt/m K°) to about 150 (Watt/m K°), for example about 138 (Watt/m K°). The target material has a coefficient of electrical conductivity between about 40 (μ Watt cm at 20° C.) to about 60 (μ Watt cm at 20° C.), for example about 53.4 (μ Watt cm at 20° C.). The target 106 has a target metal grain size from about 50 microns to about 70 microns, for example, about 60 microns.

The target 106 includes a mounting region 207, recess 209, a channel 223, and a support region 253. The mounting region 207 is disposed radially outward of the support region 253. The mounting region 207 includes an upper face 221, a mounting face 205, an outer face 252, the channel 223, an extension length 225, and mounting thickness 201.

The outer face 252 is the radially outward face of the target 106 and defines a diameter of the target 106. The outer face 252 diameter is between about 15 inches to about 48 inches. For example, between about 18 inches and about 21 inches. For example, about 20 inches.

The extension length 225 is the distance between sidewalls 217 of the support region 253 and the outer face 252. The extension length 225 is about 2 inches to about 4 inches, for example about 3 inches.

The mounting thickness 201 is the distance between the upper face 221 and mounting face 205. The mounting thickness 201 is about 0.3 inches to about 0.7 inches, for example about 0.5 inches.

The mounting face 205 includes elements to mount the target 106 to the magnetron assembly 111. The elements of the mounting face 205 include one or more apertures, threaded holes, or other types of geometry to affix the target to the magnetron assembly 111.

The channel 223 is formed within the upper face 221 of the mounting region 207. In some embodiments, the channel 223 is disposed radially outward of the sidewalls 217 of the support region 253. For example, the channel 223 is disposed between about 0.1 inches to about 2 inches radially outward from the sidewalls 217 of the support region 253. In some embodiments the channel 223 includes a dovetail geometry. The dovetail geometry enables a seal, such as an O-ring, to be disposed therein. The channel 223 is described in more detail below.

The support region 253 is disposed radially inward of the mounting region 207. The support region 253 includes a support region thickness 248, a support region width 227, sidewalls 217, and a process face 215.

The support region thickness 248 is defined by the distance between the process face 215 and a recess face 210, of the recesses 209. The support region thickness 248 is between about 0.7 inches to about 0.2 inches, for example about 0.27 inches to about 0.39 inches. In some embodiments the support region thickness 248 is uniform. In other embodiments, the support region thickness 248 varies radially from the center to the process face 215 to the sidewalls 217.

The process face 215 partially defines the support region 253. The process face 215 includes a flat surface parallel to the mounting face 205. When the target 106 is placed in a process chamber, the process face 215 faces the substrate. The process face 215 includes a diameter. In some embodiments, the process face diameter is the same as the support region diameter 227. The process face 215 of the support region 253 has an angled face 203 at a downward slope, toward the upper face 221, from a first process face point 229 of the process face 215 to the second process face point 219. The support region diameter 227 is defined as the diameter formed by the sidewalls 217. The support region diameter 227 is about 15 inches to about 18 inches, for example about 17.5 inches. The sidewalls 217 are a radial vertical face that partially defines the support region 253. The sidewalls 217 have a height from the second process face point 219 to the upper face 221 of the mounting region 207. The sidewalls 217 height is between about 0.3 inches and about 0.4 inches. For example, the sidewalls 217 height is between about 0.32 inches and about 0.38 inches The recess 209 is disposed opposite the process face 215 of the support region 253 and opposite the upper face 221 of the mounting region 207. The recess 209 is a cavity within the target 106. The recess 209 includes the recess face 210, a recess diameter 211, a recess radius 213, and a recess depth 249.

The recess depth 249 is between the recess face 210 and the mounting face 205. The recess depth 249 is between about 0.1 inches and about 0.15 inches. The recess 209 is recessed from the mounting face 205 to the recess face 210 by the recess depth 249. In some embodiments, the recess depth 249 is between about 0.1 inches and about 0.15 inches, for example, about 0.1 inches. The recess diameter 211 is between about 17 inches and about 20 inches. For example the recess diameter 211 is about 18.5 inches to about 19 inches. In some embodiments, the recess diameter 211 is between about 17.5 inches and about 19 inches, for example about 18.5 inches. In some embodiments, the recess diameter 211 is about 89% to about 90.5% of the total diameter of the target 106.

The target 106 also includes a height 256, a cross section 255, and an edge feature 300. The edge feature 300 is described in more detail in the discussion of FIG. 3. The height 256 is defined as the distance between the mounting face 205 and the process face 215. The height 256 is between about 0.85 inches and about 1.1 inches, for example, about 0.95 inches.

The cross section 255 is the thickness between the recess face 210 and upper face 221. The cross section 255 is about 0.3 inches to about 0.45 inches, for example, about 0.31 inches to about 0.35 inches. The cross section 255 is the cross sectional area of the target 106 that accounts for deflection during operation. If the cross section is too large, extra energy must be applied by the system to achieve a specific plasma density in the process volume. If the cross section 255 is too small, the target 106 experiences too much deflection that can lead to non-uniform erosion patterns and a reduction in the useful life of the target 106. In some embodiments, the cross section 255 is about 33% to about 37% of the target height 256. For example, the cross section 255 is about 35% of the target height 256.

Figure 3:
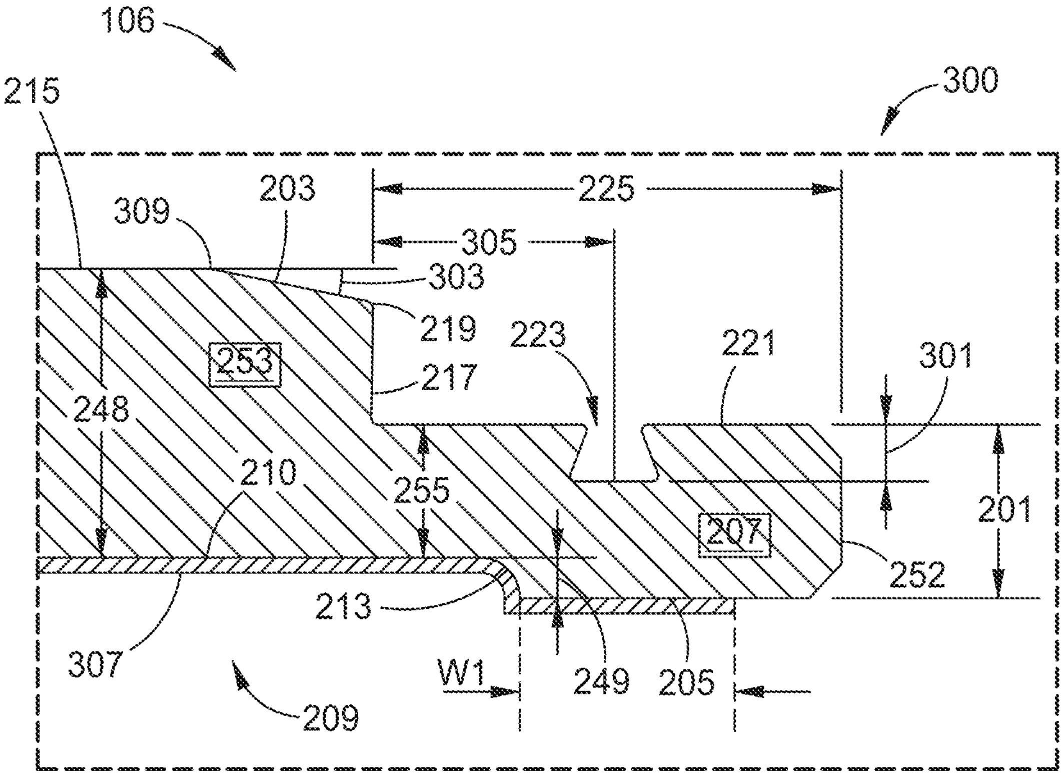
FIG. 3 is partial schematic, cross-sectional view of a target assembly according to some embodiments described herein.

FIG. 3 is a partial schematic, cross-sectional view illustrating the edge feature 300 of the target 106 according to some embodiments described herein. The edge feature 300 shown in FIG. 3 illustrates the radially outward region of the support region 253, sidewalls 217, and mounting region 207 according to some embodiments.

As illustrated in FIG. 3, the recess face 210 and recess radius 213 include a coating 307. In some embodiments, the composition of the coating 307 is selected so that the coating 307 includes a metal that is more anodic versus the pure Mo target material on the galvanic series. In some embodiments, the composition of the coating 307 is selected so that the coating 307 has a similar coefficient of thermal expansion as the Mo target material to avoid buckling or cracking of the coating 307 during repeated deposition cycles. In one example, the coating 307 is a chrome (Cr) coating. In some embodiments, the coating 307 is a nickel (Ni) coating. In other embodiments, the coating 307 is a Ni—Cr coating. In other embodiments, the coating 307 is a zirconium (Zr) coating. In other embodiments, the coating 307 may include copper (Cu), for example the coating 307 is a Ni—Cr—Cu coating. The coating 307 will include a continuous, pore free and crack free coating that has a thickness of about 0.001 inches to about 0.02 inches, for example, 0.01 inches to about 0.015 inches. In some embodiments, the coating 307 is applied through indium diffusion bonding. The coating 307 creates a corrosion resistant film so that any coolant on the back of the target 106 does not react with the recess face 210 and radius 213 of the recess 209. In other conventional target designs that include a target material attached to a backing plate that includes a different material (e.g., copper, brass, etc.), the backing plate can be selected to have corrosion resistant properties. In other conventional target designs that include a target material on a backing plate, the differing materials having different co-efficient of thermal expansions induce higher internal stresses than a monolithic target, excessive bowing of the target, and debonding. For example, a conventional target design with having a target material on copper-zinc backing plate will deflect about 5 time more than a monolithic target during operation. Further, the thermal stresses cause the backing plate and target material to deflect back towards the magnetron due to the thermal mismatch, thereby reducing the life of the target when compared to a monolithic target which would deflect toward the substrate. By using a monolithic target over a conventional target design, deflection and internal von mises stress are reduced.

The coating 307 is disposed on the recess face 210 and extends at least a width W1 on to the mounting face 205. The coating 307 extends radially outward of the recess 209 by the width W1. The width W1 is configured to enable the coating 307 to form a sealing surface that is disposed between the mounting face 205 and an O-ring (not shown) when the target 106 is mounted in the chamber 101 (FIG. 1). The width W1 extends 0.2 inches or more from the recess 209 and onto the mounting face 205. The coating 307 reduces and/or prevents corrosion of the target material that would normally occur when a DI water containing cooling fluid is in contact with the recess 209 during processing. For example, the coating 307 has an outer diameter of about 19 inches to about 20 inches, for example about 19.5 inches. The coating 307 has thickness of about 40 microns to about 60 microns, for example about 50 microns.

When mounted, the target 106 does not need a backing plate since it is a single monolithic body able to be mounted to the magnetron assembly 111. In contrast, a target assembly with a target material disposed on a backing plate so the assembly can be mounted to the magnetron assembly. The backing plate produces eddy currents that affect the voltage through the target. The mitigation of a backing plate reduces the effect of eddy currents on the voltage flowing through the target 106 during operation.

The mounting region includes the channel 223. The center of the channel 223 is disposed about 0.82 inches to about 0.84 inches from the sidewalls 217. For example, the center of the channel 223 is disposed about 0.83 inches from the sidewalls 217. The channel 223 includes a depth 301. The depth 301 is the distance that the channel 223 is recessed into the upper face 221. The depth 301 is about 0.13 inches to about 0.15 inches from the upper face 221.

As shown, in FIG. 3, the process face 215 includes the first process face point 229 and the second process face point 219. The first process face point 229 is where the angled face 203 begins to slope down toward the upper face 221. The first process face point 229 may also define an inner diameter of the process face 215. The inner diameter may be about 15 inches to about 17 inches. For example, the first process face point 229 may define an inner diameter of the process face 215 of about 16.4 inches. The downward slope of the angled face 203 is at an edge angle 303. The edge angle 303 is between about 0° and about 45° from the process surface 215. The angled face 203 intersects the sidewalls 217 at the second process face point 219. The sidewalls 217 are perpendicular to the upper face 221 of the mounting region 207.

As shown, the channel 223 is disposed radially outward of the support region 253 and recess 209. This location further aids the target 106 by allowing additional strength to be imparted to the target rigidity through the cross section 255. If the recess 209 and channel 223 were overlapped, the cross section 255 would be further reduced, limiting the strength and rigidity of the target 106, which would diminish the target life 106.

The inventors have found the surprising effect of enhanced device life when a ratio between the recess depth 249 and the support region thickness 248 is between about 0.13 to about 0.15, for example about 0.14. In other words, the recess depth 249 is about 14% of the support region thickness 248.

The inventors have found the surprising effect of enhanced device life when a ratio between the height 256, the cross section 255, the recess depth 249, and the support region thickness 248 is about 0.9:0.12:0.33. For example, the target life is prolonged when the recess depth 249 is about 33% to about 37% of the cross section 255. For example, when the recess depth 249 is equal to about 35.5% of the cross section 255 distance.

Additionally, unlike multi-material targets, the monolithic target 106 bows away from the mounting face 205 and towards the process face 215. This change in the direction of the bow influences the importance of the above and below described dimensions. Thus, the corresponding ratios enhance the target life of the monolithic target 106.

When the word "approximately" or "about" are used, this term may mean that there may be a variance in value of up to ±10%, of up to 5%, of up to 2%, of up to 1%, of up to 0.5%, of up to 0.1%, or up to 0.01%.

While the foregoing is directed to embodiments of the present disclosure, other and further embodiments of the disclosure may be devised without departing from the basic scope thereof, and the scope thereof is determined by the claims that follow.

What is claimed is:

1. A physical vapor deposition (PVD) target, comprising:
a monolithic molybdenum target comprising:
a support region partially defined by a process face and radial sidewalls;
a mounting region disposed radially outward of the support region, the mounting region defined by an upper face and a mounting face, the radial sidewalls disposed between the upper face and the process face;
a height between about 0.85 inches and about 1.1 inches, the height defined between the process face and the mounting face; and
a recess disposed within the mounting face of the monolithic molybdenum target, the recess disposed opposite the process face and extending radially outward of the radial sidewalls, the recess comprising a recess radius; and
a coating disposed on a recess face of the recess, the recess radius, and extending a width onto the mounting face.

2. The PVD target of claim 1, wherein a purity of the target is at least 99.999%.

3. The PVD target of claim 1, wherein the mounting region comprises an outer face defining a radially outer-most face of the PVD target.

4. The PVD target of claim 3, wherein the recess extends radially into the mounting region and is further disposed radially inward of the outer face.

5. The PVD target of claim 4, wherein the mounting region further comprises a channel in the upper face of the mounting region, the channel being disposed radially outward of the recess.

6. The PVD target of claim 5, wherein a diameter of the recess is about 90% of a diameter of the PVD target.

7. The PVD target of claim 3, wherein the mounting region further comprises a channel in the upper face of the mounting region, the channel having a dovetail geometry.

8. The PVD target of claim 1, wherein the coating is a nickel coating.

9. The PVD target of claim 1, wherein a recess depth is about 14% of a thickness of the support region.

10. A physical vapor deposition (PVD) target, comprising:
a monolithic molybdenum target comprising:
a support region partially defined by a process face and radial sidewalls;
a mounting region disposed radially outward of the support region, the mounting region comprising:
a mounting face and an upper face disposed between the process face of the support region and the mounting face, the radial sidewalls disposed between the upper face and the process face; and
a channel disposed in the upper face;
a recess disposed within the mounting face, opposite the process face, and into the support region and mounting region, the recess comprising a recess radius;
a height between about 0.85 inches and about 1.1 inches, the height defined between the process face and the mounting face; and
a coating disposed on a recess face of the recess, the recess radius, and extending a width onto the mounting face.

11. The PVD target of claim 10, further comprising a cross section defined between the upper face and the recess face, wherein the cross section is disposed radially inward of the channel and is about 33% to about 37% the height of the target.

12. The PVD target of claim 11, wherein a depth of the recess is about 33% to about 37% of the cross section.

13. The PVD target of claim 10, wherein the process face further comprises an angled face disposed radially outward of the process face and slopes toward the upper face of the mounting region.

14. The PVD target of claim 10, wherein the sidewalls are a vertical face.

15. A physical vapor deposition (PVD) target comprising:
a monolithic molybdenum target comprising:
a support region, the support region being partially defined by a process face and radial sidewalls;
a mounting region disposed radially outward of the support region, the mounting region comprising:
a mounting face and an upper face disposed between the process face of the support region and the mounting face, the radial sidewalls disposed between the upper face and the process face; and
a channel disposed in the upper face;
a height between about 0.85 inches and about 1.1 inches, the height defined between the process face and the mounting face;
a recess disposed within the mounting face, opposite the process face, and into the support region and mounting region, the recess comprising a recess diameter of about 90% of a diameter of the PVD target and a recess radius; and
a coating disposed on a recess face of the recess, the recess radius, and extending a width onto the mounting face.

16. The PVD target of claim 15, further comprising a cross section defined between the upper face and the recess face, wherein the cross section is disposed radially inward of the channel and is about 33% to about 37% a height of the PVD target.

17. The PVD target of claim 16, wherein a depth of the recess is about 33% to about 37% of the cross section.

* * * * *